(12) United States Patent
Ma et al.

(10) Patent No.: US 6,207,586 B1
(45) Date of Patent: Mar. 27, 2001

(54) OXIDE/NITRIDE STACKED GATE DIELECTRIC AND ASSOCIATED METHODS

(75) Inventors: Yi Ma; Pradip Kumar Roy, both of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/334,911

(22) Filed: Jun. 17, 1999

Related U.S. Application Data

(60) Provisional application No. 60/106,011, filed on Oct. 28, 1998, and provisional application No. 60/127,757, filed on Apr. 5, 1999.

(51) Int. Cl.$^7$ .......................... H01L 21/31; H01L 21/469
(52) U.S. Cl. .......................... 438/763; 438/761; 438/762; 438/287; 438/791; 438/792
(58) Field of Search .......................... 438/763, 761, 438/762, 287, 792, 791

(56) References Cited

U.S. PATENT DOCUMENTS

| | | | |
|---|---|---|---|
| 5,264,724 | * 11/1993 | Brown et al. | |
| 5,466,617 | * 11/1995 | Shannon | |
| 5,567,476 | * 10/1996 | Law et al. | |
| 5,650,334 | 7/1997 | Ito et al. | 437/40 |
| 5,714,408 | * 2/1998 | Ichikawa et al. | |
| 5,800,621 | * 9/1998 | Redeker et al. | |
| 5,879,975 | 3/1999 | Karlsson et al. | 438/162 |
| 5,885,877 | 3/1999 | Gardner et al. | 438/300 |
| 5,891,809 | 4/1999 | Chau et al. | 438/770 |
| 5,985,725 | * 11/1999 | Chou | |

OTHER PUBLICATIONS

Yider Wu, Gerald Lucovsky, and H.Z. Massoud, Improvement of Gate Dielectric Reliability for p+Poly MOS Devices Using Remote PECVD Top Nitride Deposition on Thin Gate Oxides, 36th Annual Reliability Physics Symposium Proceedings, Apr. 1998.*

\* cited by examiner

*Primary Examiner*—Charles Bowers
*Assistant Examiner*—Stephen W. Smoot
(74) *Attorney, Agent, or Firm*—Allen, Dyer, Doppelt, Milbrath & Gilchrist, P.A.

(57) ABSTRACT

A method for making an oxide/nitride stacked layer makes the nitride layer defective so that it is semi-transparent or permeable to oxygen. The method includes first forming an oxide layer on a semiconductor substrate. The defective nitride layer is formed on the oxide layer using direct plasma enhanced chemical vapor deposition. The defective nitride layer is formed while exposing the plasma with a low energy magnetic field for providing a uniform energy distribution across a surface of the oxide layer. A resulting distribution of thicknesses of the defective nitride layer has a standard deviation less than about 1.5% across a wafer. The defective nitride layer is permeable to oxygen so that when the semiconductor substrate is annealed, the interface trap sites are significantly reduced or eliminated.

41 Claims, 4 Drawing Sheets

FIG. 4
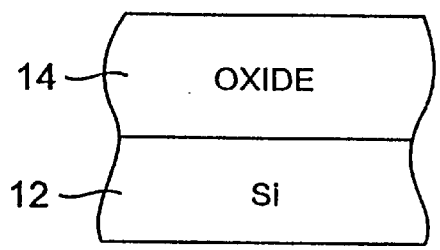
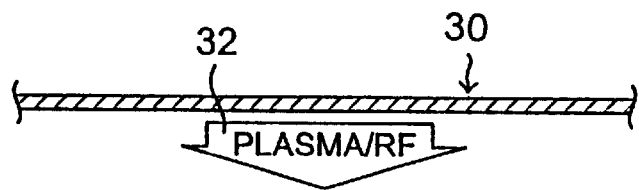
FIG. 5
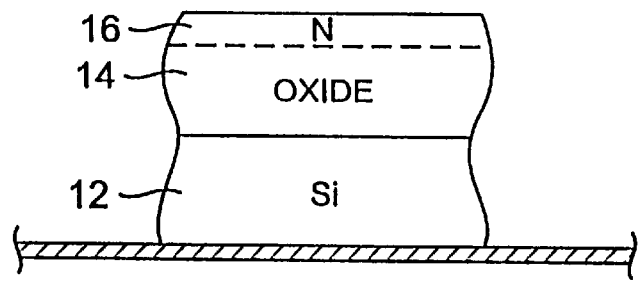
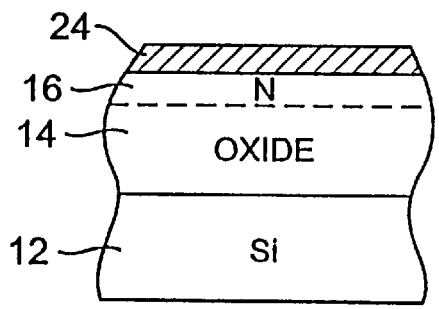
FIG. 6

OXIDE/NITRIDE STACKED GATE DIELECTRIC AND ASSOCIATED METHODS

RELATED APPLICATIONS

This application is based upon prior filed copending provisional application Ser. No. 60/106,011 filed Oct. 28, 1998, and prior filed copending provisional application Ser. No. 60/127,757 filed Apr. 5, 1999, the entire disclosures of which are incorporated herein by reference.

FIELD OF THE INVENTION

The present invention relates to the field of semiconductor devices, and, more particularly, to an oxide fabrication method and corresponding oxide layer for a semiconductor device.

BACKGROUND OF THE INVENTION

An insulated-gate field-effect transistor, such as a metal-oxide semiconductor field-effect transistor (MOSFET), uses a gate to control an underlying channel extending between source and drain regions in the semiconductor substrate. Typically, the substrate is divided into a plurality of active regions through an isolation process, such as field oxidation or shallow trench isolation. A thin oxide layer is grown on an upper surface of the semiconductor substrate in the active regions. This thin oxide layer serves as the gate dielectric for subsequently formed transistors. A plurality of polysilicon gates are formed, and dopants are implanted to define the source/drain regions.

As transistor channels shrink below 0.5 microns, the limitations of conventional transistor processing become more apparent. To reduce short channel effects and operating voltage in deep sub-micron transistors, the depth of the source/drain junctions and the thickness of the gate oxides are desirably reduced. Devices become more susceptible, however, to diffusion of electrically active impurities located in the gate across the gate oxide and into the active area of the transistor as the gate oxide thickness decreases below 50 angstroms.

The presence of these impurities within the channel region can undesirably alter the threshold voltage of the device. This problem is especially acute for boron implanted gates. For example, when forming a P-channel MOS transistor, boron is typically implanted into the polysilicon gate. Such implanted boron may diffuse through a thin gate oxide into the underlying channel and silicon substrate and adversely affect device performance.

A number of techniques have been developed to attempt to reduce diffusion of dopants, especially boron, into the gate oxide and into the underlying channel. For example, U.S. Pat. No. 5,650,344 to Ito et al. discloses a polysilicon gate separated by a re-oxidized nitrided oxide film. The nitrided region underlying the gate oxide retards the diffusion of boron from the boron doped polysilicon gate into the silicon substrate. U.S. Pat. No. 5,879,975 to Karlsson et al. discloses nitrogen implantation at high levels into the gate to prevent subsequent impurity penetration through the gate oxide.

Other similar methods are disclosed by U.S. Pat. No. 5,885,877 to Gardner et al., wherein a nitride diffusion retarding barrier layer is disposed at the bottom of the gate to reduce dopant which diffuses into the gate oxide from the gate. In particular, a lower gate layer provides a diffusion-retarding barrier layer against dopant diffusion into the gate oxide disposed therebelow, and an upper gate layer is formed on the lower nitrogen layer and is doped to form a highly conductive layer. Together, the upper and lower gate layers form a composite gate electrode which incorporates a diffusion-retarding barrier adjacent to the underlying gate dielectric.

U.S. Pat. No. 5,891,809 to Chau et al. discloses a method for forming a very thin nitrided oxide layer. First, a substrate is oxidized in a chlorinated dry oxidation followed by a low temperature pyrogenic steam oxidation. Next, a low temperature anneal is performed, followed by a high temperature anneal in an inert ambient.

An article titled "Improvement of Gate Dielectric Reliability for p+Poly MOS Devices Using Remote PECVD Top Nitride Deposition on Thin Gate Oxides" by Wu et al. discloses a dual layer dielectric formed by remote plasma enhanced chemical vapor deposition (RPECVD) of an ultra-thin stoichiometric nitride onto a thin oxide thermally grown on an n-type silicon substrate. A 0.8 nm layer of plasma nitride blocks boron atom diffusion from a heavily implanted p+ polysilicon gate electrode under conditions of an aggressive implant activation anneal.

A thermally grown oxide is typically formed by exposing the silicon substrate surface to an oxygen containing ambient. In a wet oxidation process, steam is included in the ambient. The oxygen causes the silicon surface to be partially consumed and converted into the oxide. A rate of growth of the oxide depends on a number of factors, and, unfortunately, irregularities and defects occur in the oxide. Such irregularities may be caused by irregularities in the silicon surface and/or from the oxide itself. So called "interface trap sites" may be formed at the oxide/silicon interface which severely limits the device electrical performance. Post oxidation anneal reduces these interface trap sites, and consequently, an interface trap site density associated therewith. As discussed above, nitrogen is incorporated into the oxide layer to suppress boron penetration. Unfortunately, nitrogen is opaque to oxygen, and the interface trap sites can not be completely reduced or eliminated during the anneal.

Furthermore, thinner gate oxides also increase concerns about hot carrier damage, higher leakage current and oxide breakdown due, in part, to increased electrical fields across the gate oxide. In addition to reliability concerns, thin gate oxides present significant manufacturing challenges as well, particularly with respect to providing a uniform nitride thickness that can be produced repeatedly in a manufacturing environment.

Despite the problems noted, thin gate oxides are desirable because the transistor drive current is inversely proportional to the gate oxide thickness over a wide range of operating conditions. Since higher drive currents result in faster devices, a great deal of effort has been directed towards reducing the gate oxide thickness without significantly reducing the reliability of the integrated circuit.

SUMMARY OF THE INVENTION

In view of the foregoing background, it is therefore an object of the present invention to provide an oxide fabrication method and corresponding oxide layer that suppresses penetration of mobile dopants, such as boron, without reducing the reliability of a semiconductor device.

These and other advantages, features and objects in accordance with the present invention are provided by an oxide/nitride stacked layer wherein the nitride layer is formed to be defective so that it is semi-transparent or permeable to oxygen diffusion thereby permitting oxidation and silicon nitride network restructuring. The method includes first forming an oxide layer on a semiconductor substrate. The defective nitride layer is formed on the oxide layer preferably using direct plasma enhanced chemical vapor deposition. The defective nitride layer is preferably formed while exposing the plasma with a magnetic field for providing a uniform energy distribution of the plasma across a surface of the oxide layer. A resulting distribution of thicknesses of the defective nitride layer has a standard deviation less than about 1.5% across a wafer. The wafer may typically have a diameter less than about eight inches. The method further includes the step of annealing the dielectric layer for significantly reducing or eliminating the interface trap sites and defects in the defective nitride layer.

A non-defective nitride layer is one that is stoichiometric. Since a stoichiometric nitride layer is opaque to oxygen, a post deposition anneal does not remove all the interface trap sites from the oxide layer. The defective nitride layer according to the present invention advantageously allows the interface trap sites to be eliminated or significantly reduced through the post deposition anneal because the nitride layer is permeable to oxygen. In one embodiment, the interface trap site density is in a range of about $0.5E10/cm^2$ to $5E10/cm^2$, which is about two to three orders of magnitude less than the interface trap site density associated with an oxide layer having a stoichiometric nitride layer.

To form the defective nitride, the method preferably includes reacting silane ($SiH_4$) and ammonia ($NH_3$) in an inert gas in a plasma enhanced chemical vapor deposition system. A larger weight percentage of silane is flowed as compared to a flowed weight percentage of ammonia. The flow rate of silane is preferably in a range of about 1 sccm to 500 sccm, and the flow rate of ammonia is in a range of about 1 sccm to 500 sccm. The defective nitride layer includes hydrogen and nitrogen, and the amount by weight percentage of hydrogen is preferably less than about 10% of the nitrogen.

An oxide/nitride stacked layer formed with thermal oxidation and a direct plasma enhanced chemical vapor deposition provides a very low interface trap site density, with the defective nitride layer acting as a good barrier for preventing the diffusion of mobile dopants. By exposing the plasma with a low frequency magnetic field, energy distribution across the wafer is more uniform. This advantageously allows for a precisely controlled nitride thickness, uniformity, and deposition of the defective nitride layer so that the oxide/nitride stacked layer according to the present invention can be mass produced in a manufacturing environment. In addition, the oxide/nitride stacked layer improves gate dielectric without compromising mobility and drive current characteristics associated with a stoichiometric nitride layer.

Another aspect of the invention relates to a semiconductor device including a semiconductor substrate, an oxide layer on the semiconductor substrate with an interface trap site density in a range of about $0.5E10/cm^2$ to $5E10/cm^2$, and a defective nitride layer on the oxide layer. The defective nitride layer includes hydrogen and nitrogen, and the percentage of hydrogen by weight is preferably less than about 10% of nitrogen.

BRIEF DESCRIPTION OF THE DRAWINGS

FIGS. 4–6 are cross-sectional views illustrating the process steps for forming an oxide/nitride stacked layer in accordance with the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
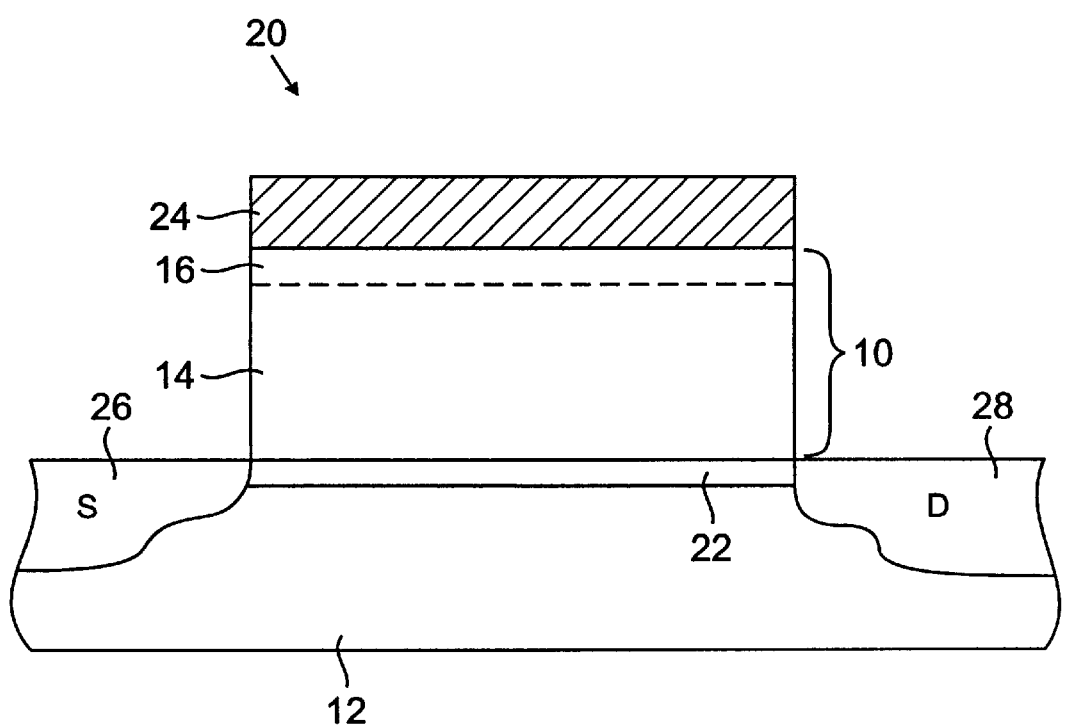
FIG. 1 is a cross-sectional view of a semiconductor device including an oxide/nitride stacked layer in accordance with the present invention.

Referring initially to FIG. 1, an oxide/nitride stacked layer 10 for a semiconductor device 20 formed using thermal oxidation and direct plasma enhanced chemical vapor deposition is now described. The oxide layer 14 is formed with thermal oxidation on the wafer, and the defective nitride layer 16 is formed with direct plasma enhanced chemical vapor deposition (PECVD) so that the nitride layer is structurally defective. The defective nitride layer 16 is formed while exposing the plasma with a low energy magnetic field for providing a uniform energy distribution of the plasma across a wafer which includes a semiconductor substrate 12 of the semiconductor device 20. This results in a distribution of thicknesses of the defective nitride layer 16 having a standard deviation less than about 1.5% across the wafer.

Using only direct plasma enhanced chemical vapor deposition without exposing the plasma produces a defective nitride layer 16 having a thickness with a standard deviation in a range of about 2% to 5% across a wafer. Accordingly, nitride thickness, uniformity, and deposition of the defective nitride layer 16 are controlled so that an oxide/nitride stacked layer according to the present invention can be mass produced in a manufacturing environment.

The defective nitride layer 16 is semi-transparent to oxygen so that interface trap sites in the oxide layer 14 can be eliminated by a post deposition anneal, while still acting as a barrier for reducing the diffusion of dopants through the oxide layer 14.

A non-defective nitride layer is one that is stoichiometric, and which is therefore opaque to oxygen. Consequently, a post deposition anneal does not remove all the interface trap sites. A resulting interface trap site density of the oxide layer when the nitride layer is stoichiometric is in a range of about $1E12/cm^2$ to $1E13/cm^2$.

The defective nitride layer 16 in accordance with the present invention advantageously allows the interface trap sites to be eliminated or significantly reduced through post deposition anneal. In one embodiment, the interface trap site density of the oxide layer 14 with the defective nitride layer 16 is in a range of about $0.5E10/cm^2$ to $5 E10/cm^2$, which is about two to three orders of magnitudes less than the interface trap site density associated with the conventional stoichiometric nitride layer.

The oxide/nitride stacked layer 10 may be used as a gate dielectric for a metal oxide semiconductor (MOS) transistor 20. However, application of the oxide/nitride stacked layer 10 according to the present invention is not limited to MOS transistors, as readily appreciated by one skilled in the art.

Still referring to FIG. 1, the oxide/nitride stacked layer 10 serves as an insulating layer over a channel region 22, and separates the channel region from an overlying gate 24. The gate 24 is preferably a metal or doped polysilicon layer. The transistor 20 includes doped source and drain regions 26, 28 in the substrate 12, with the channel region 22 extending therebetween. The defective nitride layer 16 reduces diffusion of dopants from the conductive gate 24, especially boron, into the oxide layer 14 and into the underlying channel region 22.

The oxide layer 14 is preferably formed having a thickness in a range of about 10 angstroms to 200 angstroms. In addition to the defective nitride layer 16 reducing the diffusion of dopants from the conductive gate 24, the reliability of the oxide/nitride stacked layer 10 functioning as a gate dielectric is improved because the interface trap site density is reduced, and a susceptibility to stress induced interface state formation is also reduced, all of which would severely limit the electrical performance of a semiconductor device. As a result of exposing the plasma with a magnetic field, nitride thickness, uniformity, and deposition of the defective nitride layer 16 are controlled using direct plasma enhanced chemical vapor deposition so that an oxide/nitride stacked layer according to the present invention can be mass produced in a manufacturing environment.

Figure 2:
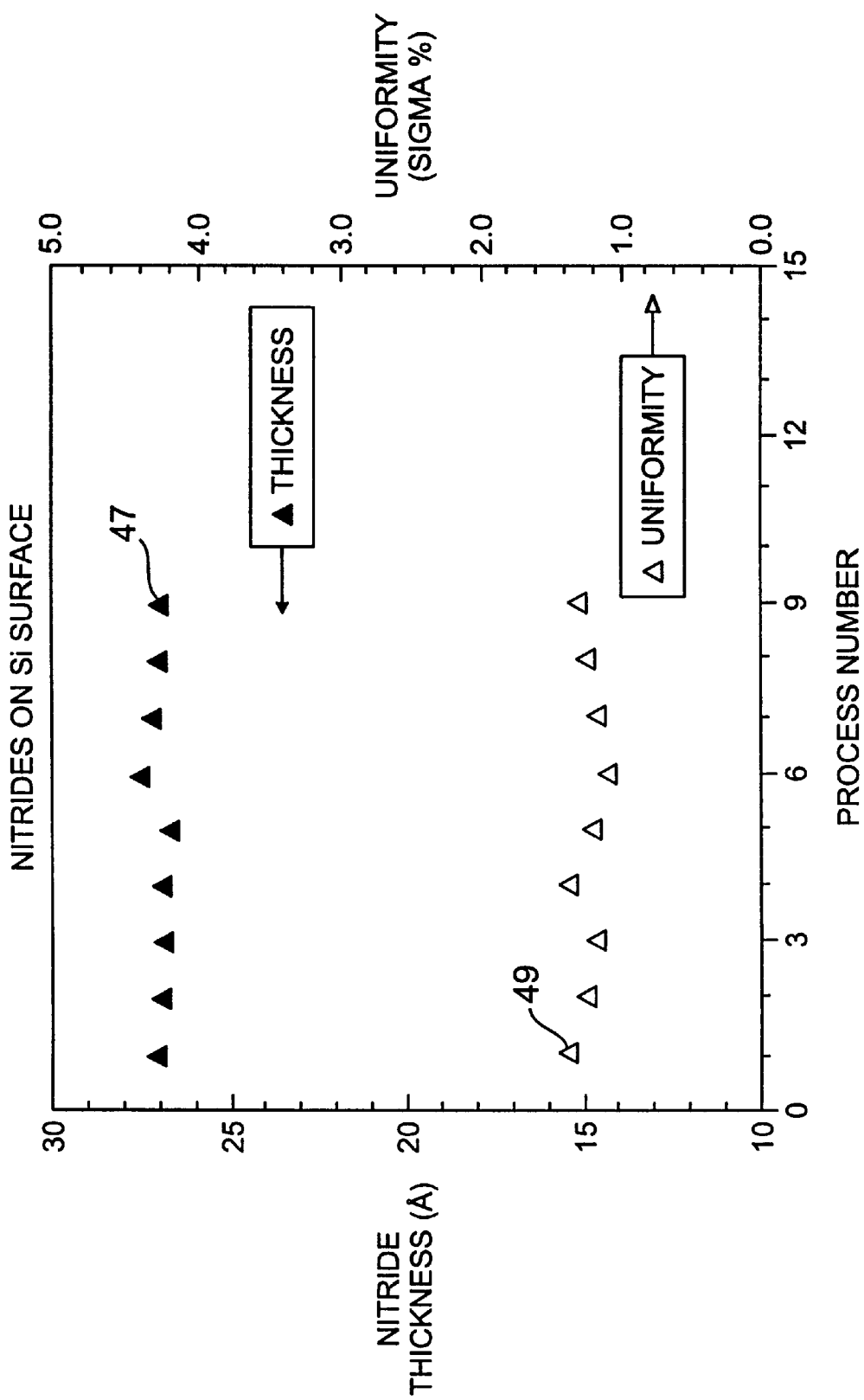
FIG. 2 is graph including comparative plots of a thickness and uniformity of a defective nitride layer in accordance with the present invention.

Referring to FIG. 2, respective plots of a thickness and uniformity of the defective nitride layer 16 for an increasing number of manufacturing processes in accordance with the present invention are described. Plots 47 represent the various thicknesses of the defective nitride layer 16 when manufactured in quantities of one through nine. Plots 49 represent the corresponding uniformity of the manufacturing processes in plots 47. For a defective nitride thickness of about 27 angstroms, a standard deviation of the thickness is about 1%.

Exposing the plasma with a low energy magnetic field, e.g., 200 kHz at 4.0 watts or less, provides a uniform energy distribution of the plasma across a surface of the wafer. In other words, the thickness of the defective nitride layer 16 from a center to an edge has a standard deviation in a range of less than about 1.5%, and typically about 1%. Without exposing the plasma to a low energy magnetic field, a standard deviation of the thicknesses of the defective nitride layer 16 across the wafer is in a range of about 2% to 5%. A controlled nitride thickness, uniformity, and deposition of the defective nitride layer 16 using direct plasma enhanced chemical vapor deposition according to the present invention permits an oxide/nitride stacked layer 10 to be reliably mass produced in a manufacturing environment.

Figure 3:
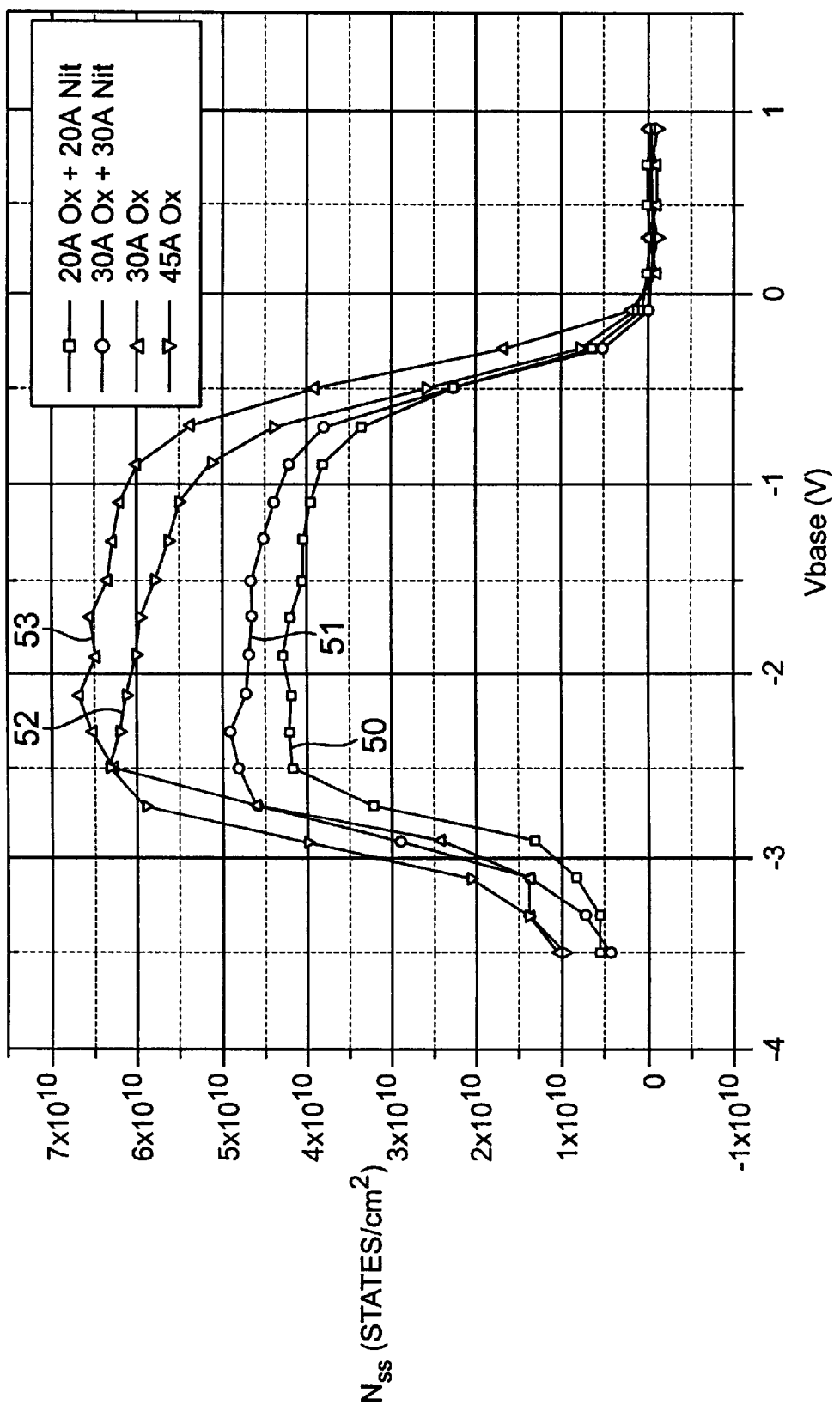
FIG. 3 is graph including comparative plots of interface trap site density for an oxide/nitride stacked layer in accordance with the present invention and for a conventional oxide.

Referring to FIG. 3, plots of the interface trap site density of the oxide/nitride stacked layer 10 in accordance with the present invention are described. When the oxide layer 14 has a thickness of 20 angstroms and the defective nitride layer also has a thickness of 20 angstroms, the interface trap site density is about $4E10/cm^2$, as indicated by plot line 50. When the oxide layer 14 and the defective nitride layer both have a thickness of 30 angstroms, the interface trap site density is about $4.7E10/cm^2$, as indicated by plot 51. Without the defective nitride layer 16, the interface trap site density increases to about $5.8E10/cm^2$ for an oxide thickness of 30 angstroms, as indicated by plot 52. When the oxide thickness is 45 angstroms, the interface trap site density is about $6.4E10/cm^2$, as indicated by plot 52.

A method of forming an oxide/nitride stacked layer 10 with thermal oxidation and plasma enhanced chemical vapor deposition as described above will now be further discussed with reference to FIGS. 4–6. The oxide/nitride stacked layer 10 may be formed, for example, on a semiconductor substrate 12. The semiconductor substrate 12 is preferably silicon, or may be a silicon or polysilicon layer or structure formed on the substrate.

Alternatively, the oxide/nitride stacked layer 10 may be grown on a different type semiconductor substrate, layer or structure. The method may be used to form an oxide/nitride stacked layer 10 of any desired thickness. However, the method is particularly useful in forming ultra-thin gate oxide layers preferably in the range of about 10 angstroms to 200 angstroms.

An oxide layer 14 is formed using thermal oxidation over the surface of the semiconductor substrate 12, as shown in FIG. 4. Thermal oxide growth is a relatively straightforward chemical reaction. Elevated oxidation temperatures are required to achieve quality oxides in reasonable process times, as will be readily understood by one skilled in the art. In one embodiment, the oxidation temperatures are in a range of about 900° C. to 1200° C.

The defective nitride layer 16 is formed using direct plasma enhanced chemical vapor deposition, as shown in FIG. 5. Direct plasma enhanced chemical vapor deposition systems typically include a parallel plate chamber 30 operated at low pressure. A radio-frequency induced glow discharge, or other plasma source is used to induce plasma 32 in the deposition gas, as will be readily understood by one skilled in the art.

The defective nitride layer 16 is thus formed on the oxide layer 14 using direct plasma enhanced chemical vapor deposition so that the defective nitride layer is permeable to oxygen diffusion thereby permitting oxidation and silicon nitride network restructuring. The defective nitride layer 16 is formed while exposing the plasma 32 with a low energy magnetic field for providing a uniform energy distribution of the plasma across a surface of the oxide layer 14, as explained above.

To form the defective nitride layer 14 in the direct plasma enhanced chemical vapor deposition system 30, the deposition gas may include silane and ammonia. However, a larger weight percentage of silane is intentionally flowed as compared to the weight percentage of ammonia. In other words, the deposition gas is silane rich. The silane decomposes into silicon and hydrogen so that the silicon provides a silicon source for the nitride. The ammonia provides the nitrogen source for the nitride.

Referring to Table 1 below, representative direct plasma enhanced chemical vapor deposition parameters are provided for forming the defective nitride layer 16. For each parameter listed, a corresponding range is provided along with a preferred value. For example, the deposition temperature may be in a range of about 250° C. to 550° C., with a preferred temperature of about 480° C. With respect to the frequency of the plasma power source, a frequency of 13.56 MHZ at a power level in a range of about 10 watts to 500 watts is provided. A preferred power level at the frequency of 13.56 MHZ is 65 watts.

The plasma 32 is then excited with a low frequency power source. The frequency of this power source may be in a range of about 50 kHz to 400 kHz, with a preferred frequency of about 200 kHz. The corresponding power level is in a range of about 5 watts to 500 watts. A preferred power level at the frequency of 200 kHz is 40 watts. Pressure within the direct plasma enhanced chemical vapor deposition system 30 is in a range of about 1 mTorr to 500 Torr, with a preferred pressure of 3 Torr.

TABLE 1

| Parameters | Range | Preferable |
|---|---|---|
| Deposition temperature | 250° C.–550° C. | 480° C. |
| Plasma Power (13.56 MHZ) | 10 watts–500 watts | 65 watts |
| Plasma power (200 kHz) | 5 watts–500 watts | 40 watts |
| Pressure | 1 mTorr–500 Torr | 3 Torr |
| $SiH_4$ | 1 sccm–500 sccm | 50 sccm |
| $NH_3$ | 1 sccm–500 sccm | 10 sccm |
| $N_2$ | 100 sccm–2000 sccm | 1000 sccm |
| Ar | 100 sccm–2000 sccm | 500 sccm |

As previously stated, the weight percentage of silane that is flowed compared to the weight percentage of ammonia is such that the mixture is silane rich. A silane rich mixture causes defective nitride to form. The flow rate of silane is selected from a range of about 1 sccm to 500 sccm, and the flow rate of ammonia is selected from a range of about 1 sccm to 500 sccm so that the amount of hydrogen in the defective nitride layer 16 is low, preferably less than about 10% by weight percentage. A preferred flow rate of silane is 50 sccm and a preferred flow rate of ammonia is 10 sccm. As an alternative to forming the defective nitride layer 16 using silane and ammonia, the defective nitride layer is formed by reacting silane in a nitrogen discharge. The plasma includes nitrogen and argon, with a flow rate of each selected from a range of about 100 sccm to 2,000 sccm. A preferred flow rate of nitrogen is 1,000 sccm, and a preferred flow rate of argon is 500 sccm.

After the defective nitride layer 16 is formed, a post deposition anneal is performed to remove the interface trap sites in the oxide layer 14 and defects in the nitride layer 16. Because the defective nitride layer 16 is permeable to oxygen, the interface trap sites are reduced or eliminated so that the resulting interface trap site density is in a range of about $0.5E10/cm^2$ to $5E10/cm^2$.

The post deposition anneal is preformed in a rapid thermal processing (RTP) chamber or in a furnace. Tables 2A and 2B below respectively list the anneal parameters within a range, along with a preferred parameter, for the rapid thermal processing chamber and the furnace. The oxidation temperature is in a range of about 750° C. to 1,000° C. for both the oxidation processes. A preferred oxidation temperature level is 900° C. for the rapid thermal process and 800° C. for the furnace process. The pressure and oxygen and nitrogen flow rate amounts are the same for either oxidation process, as reflected in Tables 2A and 2B. A time duration for performing the rapid thermal process is in a range of 1 second to 3 minutes, with a preferred time of 30 seconds. A time duration for the furnace process is in a range of 1 to 30 minutes, with a preferred time of 5 minutes.

TABLE 2A

| Parameters | Range | Preferable |
|---|---|---|
| Oxidation temperature | 750°–1000° C. | 900° C. |
| Pressure | 1 Torr–760 Torr | 760 Torr |
| $O_2$ | 1 sccm–500 sccm | 10 sccm |
| $N_2$ | 100 sccm–5000 sccm | 2000 sccm |
| Time | 1 sec.–3 min. | 30 sec |

TABLE 2B

| Parameters | Range | Preferable |
|---|---|---|
| Oxidation temperature | 750°–1000° C. | 800° C. |
| Pressure | 1 Torr–760 Torr | 760 Torr |
| $O_2$ | 1 sccm–500 sccm | 10 sccm |
| $N_2$ | 100 sccm–5000 sccm | 2000 sccm |
| Time | 1 min.–30 min. | 5 min. |

After the oxide/nitride stacked layer 10 is formed, a subsequent step for forming a MOS transistor is to form a conductive gate 24 above the oxide/nitride stacked layer, as shown in FIG. 6. Preferably, the conductive gate 24 is formed of a heavily doped polysilicon. Such a conductive gate structure is well known by one skilled in the art, and is typically formed by depositing polysilicon upon an upper surface of the oxide/nitride stacked layer 10 at low pressure using a chemical vapor deposition process, as readily known by one skilled in the art.

Subsequent to the formation of the gate electrode 24, lightly doped impurity distributions are introduced into a pair of lightly doped source/drain regions 26, 28. As shown in FIG. 1, the source/drain regions 26, 28 are laterally disposed on either side of the channel 22 of the semiconductor substrate 12. Preferred methods of introducing impurity distributions into the pair of source/drain regions 26, 28 include implanting ions of a suitable impurity, such as boron, arsenic or phosphorous, as is well known by one skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method of making a dielectric layer for a semiconductor device, the method comprising the steps of:

forming an oxide layer on a semiconductor substrate; and forming a defective nitride layer on the oxide layer using direct plasma enhanced chemical vapor deposition so that the defective nitride layer is permeable to oxygen, the defective nitride layer being formed while exposing the plasma with a magnetic field for providing a uniform energy distribution across a surface of the oxide layer.

2. A method according to claim 1, wherein the semiconductor substrate comprises a wafer; and wherein the step of providing a uniform energy distribution provides a distribution of nitride thicknesses having a standard deviation of less than about 1.5% across the wafer.

3. A method according to claim 2, wherein the wafer has a diameter of less than about 8 inches.

4. A method according to claim 1, wherein the step of exposing the plasma with a magnetic field is performed using a radio frequency signal having an operating frequency in a range of about 50 kHz to 400 kHz.

5. A method according to claim 1, wherein the step of exposing the plasma with a magnetic field is performed using a radio frequency signal having a power level in a range of about 1 watt to 10 watts.

6. A method according to claim 1, further comprising the step of annealing the dielectric layer.

7. A method according to claim 1, wherein an interface trap site density of the oxide layer is in a range of about $0.5E10/cm^2$ to $5E10/cm^2$.

8. A method according to claim 1, wherein the direct plasma enhanced chemical vapor deposition is performed with a radio frequency signal having a frequency in a range of about 11 MHz to 16 MHz.

9. A method according to claim 1, wherein the direct plasma enhanced chemical vapor deposition is performed with a plasma power in a range of about 10 watts to 500 watts.

10. A method according to claim 1, wherein the step of forming the defective nitride layer comprises reacting silane and ammonia in an inert gas.

11. A method according to claim 1, further comprising the steps of providing a flow of silane at a rate in a range of about 1 sccm to 500 sccm, and providing a flow of ammonia at a rate in a range of about 1 sccm to 500 sccm.

12. A method according to claim 1, wherein the step of forming the defective nitride layer comprises reacting silane in a nitrogen plasma.

13. A method according to claim 1, wherein the plasma comprises nitrogen and argon; and further comprising the step of providing a flow of nitrogen at a rate in a range of about 100 sccm to 2,000 sccm, and providing a flow of argon at a rate in a range of about 100 sccm to 2,000 sccm.

14. A method according to claim 1, wherein the direct plasma enhanced chemical vapor deposition is performed in a temperature range of about 250° C. to 550° C.

15. A method according to claim 1, wherein the direct plasma enhanced chemical vapor deposition is performed with a pressure in a range of about 1 mTorr to 500 Torr.

16. A method of making a dielectric layer for a semiconductor device, the method comprising the steps of:
    forming an oxide layer on a semiconductor substrate; and
    forming a defective nitride layer on the oxide layer using direct plasma enhanced chemical vapor deposition so that the defective nitride layer is permeable to oxygen, the defective nitride layer being formed while exposing the plasma with a magnetic field for providing a uniform energy distribution across a surface of the oxide layer; and annealing the dielectric layer so that the oxide layer has an interface trap site density in a range of about $0.5E10/cm^2$ to $5E10/cm^2$.

17. A method according to claim 16, wherein the semiconductor substrate comprises a wafer; and wherein the step of providing a uniform energy distribution provides a distribution of nitride thicknesses having a standard deviation of less than about 1.5% across the wafer.

18. A method according to claim 16, wherein the wafer has a diameter of less than about 8 inches.

19. A method according to claim 16, wherein the step of exposing the plasma with a magnetic field is performed using a radio frequency signal having an operating frequency in a range of about 50 kHz to 400 kHz.

20. A method according to claim 16, wherein the step of exposing the plasma with a magnetic field is performed using a radio frequency signal having a power level in a range of about 1 watt to 10 watts.

21. A method according to claim 16, wherein the direct plasma enhanced chemical vapor deposition is performed with a radio frequency signal having a frequency in a range of about 11 MHZ to 16 MHZ.

22. A method according to claim 16 wherein the direct plasma enhanced chemical vapor deposition is performed with a plasma power in a range of about 10 watts to 500 watts.

23. A method according to claim 16, wherein the step of forming the defective nitride layer comprises reacting silane and ammonia in an inert gas.

24. A method according to claim 16, further comprising the steps of providing a flow of silane at a rate in a range of about 1 sccm to 500 sccm, and providing a flow of ammonia at a rate in a range of about 1 sccm to 500 sccm.

25. A method according to claim 16, wherein the step of forming the defective nitride layer comprises reacting silane in a nitrogen plasma.

26. A method according to claim 16, wherein the plasma comprises nitrogen and argon; and further comprising the step of providing a flow of nitrogen at a rate in a range of about 100 sccm to 2,000 sccm, and providing a flow of argon at a rate in a range of about 100 sccm to 2,000 sccm.

27. A method according to claim 16, wherein the direct plasma enhanced chemical vapor deposition is performed in a temperature range of about 250° C. to 550° C.

28. A method according to claim 16, wherein the direct plasma enhanced chemical vapor deposition is performed with a pressure in a range of about 1 mTorr to 500 Torr.

29. A method of making a dielectric layer for a semiconductor device, the method comprising the steps of:
    forming an oxide layer on a wafer comprising a plurality of semiconductor substrates; and
    forming a defective nitride layer on the oxide layer using direct plasma enhanced chemical vapor deposition so that the defective nitride layer is permeable to oxygen, the defective nitride layer being formed while exposing the plasma with a magnetic field for providing a uniform energy distribution of nitride thicknesses having a standard deviation of less than about 1.5% across the wafer.

30. A method according to claim 29, wherein the wafer has a diameter of less than about 8 inches.

31. A method according to claim 29, wherein the step of exposing the plasma with a magnetic field is performed using a radio frequency signal having an operating frequency in a range of about 50 kHz to 400 kHz.

32. A method according to claim 29, wherein the step of exposing the plasma with a magnetic field is performed using a radio frequency signal having a power level in a range of about 1 watt to 10 watts.

33. A method according to claim 29, further comprising the step of annealing the dielectric layer.

34. A method according to claim 29, wherein an interface trap site density of the oxide layer is in a range of about $0.5E10/cm^2$ to $5E10/cm^2$.

35. A method according to claim 29, wherein the direct plasma enhanced chemical vapor deposition is performed with a radio frequency signal having a frequency in a range of about 11 MHz to 16 MHz.

36. A method according to claim 29, wherein the direct plasma enhanced chemical vapor deposition is performed with a plasma power in a range of about 10 watts to 500 watts.

37. A method according to claim 29, wherein the step of forming the defective nitride layer comprises reacting silane and ammonia in an inert gas.

38. A method according to claim 29, further comprising the steps of providing a flow of silane at a rate in a range of about 1 sccm to 500 sccm, and providing a flow of ammonia at a rate in a range of about 1 sccm to 500 sccm.

39. A method according to claim 29, wherein the step of forming the defective nitride layer comprises reacting silane in a nitrogen plasma.

40. A method according to claim 29, wherein the plasma comprises nitrogen and argon; and further comprising the step of providing a flow of nitrogen at a rate in a range of about 100 sccm to 2,000 sccm, and providing a flow of argon at a rate in a range of about 100 sccm to 2,000 sccm.

41. A method according to claim 29, wherein the direct plasma enhanced chemical vapor deposition is performed in a temperature range of about 250° C. to 550° C.

* * * * *